United States Patent [19]

Katz et al.

[11] Patent Number: 4,588,958
[45] Date of Patent: May 13, 1986

[54] ADJUSTABLE REFLECTIVE PREDISTORTION CIRCUIT

[75] Inventors: Allen Katz; Rajagopalan Sudarsanam, both of Mercer County; Donald E. Aubert, Camden County, all of N.J.

[73] Assignee: RCA Corporation, Princeton, N.J.

[21] Appl. No.: 717,877

[22] Filed: Mar. 29, 1985

[51] Int. Cl.[4] .............................................. H03F 1/32
[52] U.S. Cl. .................................... 330/149; 328/162; 455/63
[58] Field of Search .................... 330/149; 328/162; 455/50, 63; 375/60; 332/37 R

[56] References Cited

U.S. PATENT DOCUMENTS

| 4,109,212 | 8/1978 | Donnel et al. | 328/163 |
| 4,329,655 | 5/1982 | Nojima et al. | 330/149 |
| 4,430,619 | 2/1984 | Epsom et al. | 330/149 |
| 4,465,980 | 8/1984 | Huang et al. | 330/149 |
| 4,488,122 | 12/1984 | Wolkstein | 330/149 |

FOREIGN PATENT DOCUMENTS

| 56-83104 | 7/1981 | Japan. | |
| 113603 | 7/1982 | Japan | 330/149 |

OTHER PUBLICATIONS

Article entitled: Universally Applicable Technique Linearizes Microwave Power AMP Tubes, by: John Gosch, published: 9-11-80 in Microwave Magazine pp. 82-83.
Article entitled: Predistortion Nonlinear Compensator for Microwave SSB-AM System, by: Nojima et al., published by: IEEE 1980.
Book entitled: Jerrold Instruction Book for Model 3441 Amplifiers published May 1969.
"High Performance Broadband Baluns", Nagle, Ham Radio, Feb. 1980, pp. 28-34.

Primary Examiner—James B. Mullins
Attorney, Agent, or Firm—Joseph S. Tripoli; Robert L. Troike; William H. Meise

[57] ABSTRACT

A predistortion circuit of the reflective type uses antiparallel-connected diodes for the desired amplitude and phase nonlinearity. If the signal applied to the diodes is of not of the correct magnitude, the desired nonlinearity will not be obtained. The magnitude of the signal applied to the diodes is increased or decreased as required by an impedance transforming circuit. The impedance transforming circuit is tuned for the frequencies of interest. The overall distortion is reduced by applying a direct bias to the diode pair.

21 Claims, 11 Drawing Figures

ADJUSTABLE REFLECTIVE PREDISTORTION CIRCUIT

This invention relates to predistortion circuits for compensating amplitude and phase distortion of power amplifiers, and especially to reflective predistortion circuits for radio-frequency amplifiers.

Electronic signal amplifiers are used to increase the voltage, current or power of electrical signals. Ideally, amplifiers merely increase the signal amplitude without affecting the signal in any other way. However, all signal amplifiers distort the signal being amplified. The distortion results from nonlinearity of the transfer function or characteristic of the active devices of the amplifer. The distortion of a signal passing through an amplifier can be reduced by keeping the peak-to-peak signal amplitude small, and by operating the amplifier so that the signal traverses the central part of its transfer characteristic, where it is most linear. However, there are certain situations in which it is necessary for the output signal excursion to extend over a substantial part of the amplifier transfer function. This is true in the case of radio and television broadcast transmitters, where such operation is important to obtain the maximum possible output from each costly amplifier. This condition also exists in the case of high frequency amplifiers for satellite communications, because the ability to operate at high frequencies requires that the active devices have a structure which allows them to be operated only at relative moderate voltage and current bias levels, so that the signal swing is a significant portion of the bias and therefore of the overall transfer function of the amplifier. When the output signal swing of an amplifier takes excursions over substantial portions of the transfer function, the usual effect is relative compression of large signals by comparison with small signals. That is, the gain of the amplifier at large signal levels tends to be less than the gain at low signal levels. For the case of a sinusoidal input signal, the output signal is a sinusoid generally similar in appearance but with a somewhat flattened top and bottom.

It is known to predistort the signal applied to a nonlinear amplifier in order to precompensate for the expected distortion caused by the amplifier nonlinearity. A problem that arises in designing predistortion circuits is that of finding a nonlinear device which has a gain which increases with increasing signal level, and which will therefore compensate for the decrease in gain caused by the amplifier nonlinearity. Another problem is that of matching the nonlinearity of the nonlinear device to the nonlinearity of the amplifier both in amplitude and in phase. That is, the increase in gain due to predistortion must substantially match the decrease in gain with increasing signal level of the amplifier. Also, the change in delay with increasing power level must be matched by the predistortion circuit. If the predistortion circuit introduces more distortion than is compensated, there is no advantage to use of predistortion circuit.

A predistortion circuit was described at the ICC 1980 International Conference on Communications held in Seattle during Aug. 12, 1980, as described in the 1980 IEEE Proceedings of that conference. This predistortion circuit divides the signal to be predistorted into a first portion and a second portion. The first portion is delayed and applied to an output combiner. The second portion is applied to the input port of a 180° hybrid having input and output ports and two additional ports. A first additional port is coupled to a linear circuit and the second additional port is coupled to antiparallel diodes to generate third-order distortion. The distortion is controlled in amplitude and phase and applied to a second input of the output combiner in order to precancel third-order distortion. One problem which such an arrangement is that the magnitude of the input signal must be carefully controlled, so that the signal excursion at the antiparallel connected diodes is such as to generate the desired amount of distortion, no more and no less. If the signal swing applied to the antiparallel diodes is too small, insufficient distortion will be generated to properly predistort the signal to be amplified. If the input signal is too large, excessive distortion products will be generated.

Another type of known predistortion circuit applies the signal to be predistorted by way of an isolator to an input port of a 3-dB hybrid, a second port of which is coupled to a variable short-circuit. A third port is coupled to antiparallel connected diodes. The output signal is taken from the fourth port of the directional coupler. In this known arrangement, a resistor is coupled in series with the antiparallel combination of diodes. Such a resistor can be viewed as part of a voltage divider coacting with the series resistance of whichever diode happens at the moment to be on, thereby reducing the signal voltage appearing across the diode and thereby reducing the effective signal excursion across the diode transfer characteristic. This reduces the distortion. From another point of view, the linear resistance of the series resistor adds to the nonlinear diode resistance to create a sum resistor in which the nonlinearity is less pronounced.

It has been found that such prior art predistortion circuits tend to require selection of the diodes in conjunction with the particular amplifier for which the signal is to be predistorted in order to achieve both amplitude and phase connection. Also, it has been found that when the input signal is low and the series resistance has been reduced as much as possible, the predistortion arrangement may not provide sufficient predistortion compensation.

SUMMARY OF THE INVENTION

A predistorted amplifier arrangement according to the invention includes an amplifier which has a gain and is driven at a particular input impedance and signal level to produce at the output of the amplifier a desired output signal level. At the desired output signal level of the amplifier, a particular amount of nonlinearity occurs. A predistortion arrangement is coupled to the input of the amplifier. The predistortion is performed by a nonlinear device or devices to which the signals to be predistorted are applied to generate predistorted signals at the particular input signal level required by the amplifier to produce the desired output signal level. The nonlinear device or devices have a transfer characteristic including a first region exhibiting nonlinearity less than the nonlinearity of the amplifier at the desired output signal level, a second region exhibiting nonlinearity substantially equal to the nonlinearity of the amplifier at the desired output signal level, and a third region exhibiting nonlinearity greater than the nonlinearity of the amplifier at the desired output level. When the nonlinear device or devices is driven from a source having the particular impedance level, it operates in the first or third regions, so that there is insufficient or excessive predistortion, respectively. According to one aspect of the invention, a signal level transformer is coupled to the nonlinear device or devices to cause it (them) to operate in the second region while driving the amplifier with the particular input signal level, thereby providing the correct amount of predistortion. According to another aspect of the invention, the nonlinear devices are antiparallel-connected diodes, and a direct bias current or voltage is applied to the diodes to compensate for slight variations in the characteristics of the diodes, for slightly changing the distortion to better match that of the amplifier, or both.

DESCRIPTION OF THE INVENTION

Figure 1:
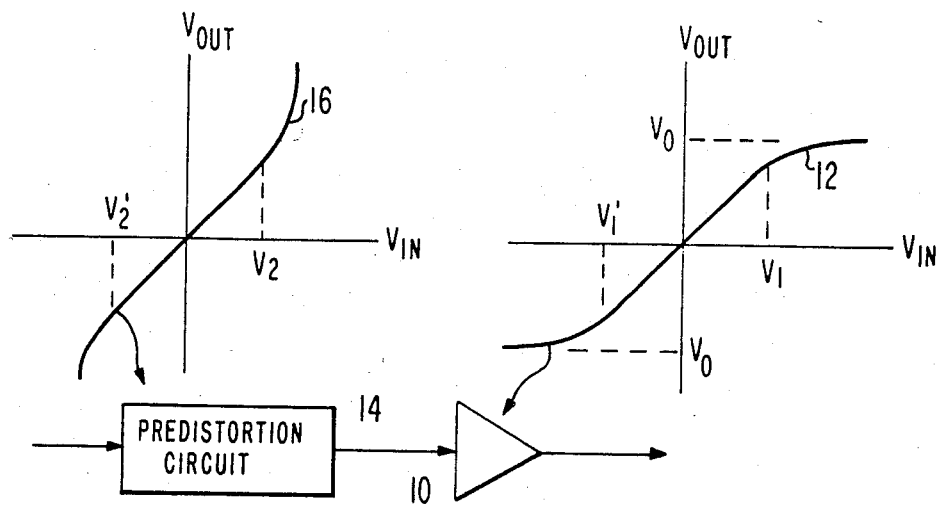
FIG. 1 is a block diagram of an amplifer and a predistortion circuit, together with plots of input and output voltage for each to illustrate their transfer functions.

FIG. 1 illustrates a signal amplifier 10 and its amplitude transfer function 12. The transfer function is a plot of the output voltage as a function of the applied input voltage to the amplifier. Since an amplifier ordinarily has gain, the output voltage is greater than the input voltage. For ease of understanding, the output voltage as represented on transfer function 12 and the other transfer functions illustrated herein have been divided by a constant such that the output voltage equals the input voltage at low signal levels. As can be seen, the output voltage tracks the input voltage linearly up to an input voltage of V1. For input voltages greater than V1, the output voltage increases more slowly or is compressed. The same is true for negative voltage input signals.

A predistortion circuit illustrated as a block 14 is coupled to the input terminal of amplifier 10 for predistorting the signal applied to the amplifier to compensate for the compression attributable to the transfer function of the amplifier. Predistortion circuit 14 has a normalized amplitude transfer function illustrated as 16. As illustrated, transfer function 16 includes a substantially linear portion extending between input voltages V2 to V2'. Outside the linear portion, transfer function 16 has an increasing output for each incremental input signal. The combination of transfer functions 12 and 16 resulting from the cascade of predistortion circuit 14 and amplifier 10 produces an overall transfer function which is linear over a region greater than either tranfer function alone. While the amplifier distortion and the predistortion also include phase or delay components, the phase transfer functions have not been shown. It will be understood that they must also match to provide the desired connection.

A nonlinear device suited to use in predistortion circuit 14 must be substantially symmetrical in its response, and must have an incremental output voltage or incremental gain which increases with increasing output level. Furthermore, such a nonlinear device should ideally be suited for operation at microwave and millimeter-wave frequencies.

Figure 2A:
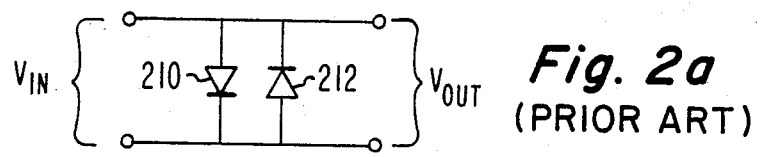
FIG. 2a illustrates antiparallel-connected diodes.
Figure 2B:
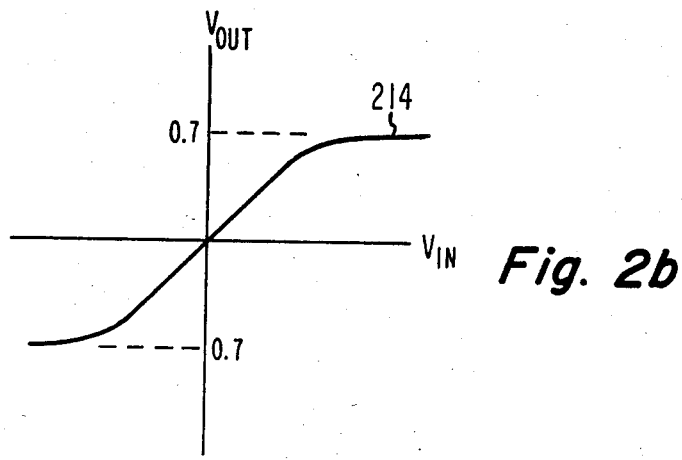
FIG. 2b illustrates their transfer function.

It is known that antiparallel connected diodes (diodes connected in parallel, but for conduction in opposite directions) have a transfer function which is substantially symmetrioal, and are suited for microwave and millimeter-wave frequencies of operation. Antiparallel-connected diodes 210 and 212 are illustrated in FIG. 2a. Such diodes exhibit an input-output voltage transfer function which has a compression characteristic rather than the desired expansion characteristic. The transfer characteristic is illustrated as 214 of FIG. 2. Such a characteristic cannot be used in a transmissive mode for correction of predistortion. It is, however, known in the art that a reflective type of predistortion circuit can be used to combine the reflection from a termination having characteristics such as 214 with reflections from a linear termination to produce the desired expansion characteristic. As mentioned above, it is also known to reduce the effective voltage applied to the antiparallel diodes by the use of a resistor (not illustrated) connected in series with the antiparallel connected diodes. This is effective when the amplifier to be predistorted has a low gain, so that a substantial signal level must be applied to the amplifier input and must therefore be processed by the predistortion circuit.

When substantial power levels are handled by the predistortion circuit, a resistor in series with the antiparallel diodes reduces the effective voltage applied to each of the diodes and thereby can reduce the predistortion to the desired amount. However, for those cases where the amplifier gain is high, the signal level at the input of the amplifier may be so low that the signal processed by the predistortion circuit can make excursions only across the substantially linear portion of the characteristic of the diodes, which therefore cannot provide sufficient distortion correction.

Figure 3:
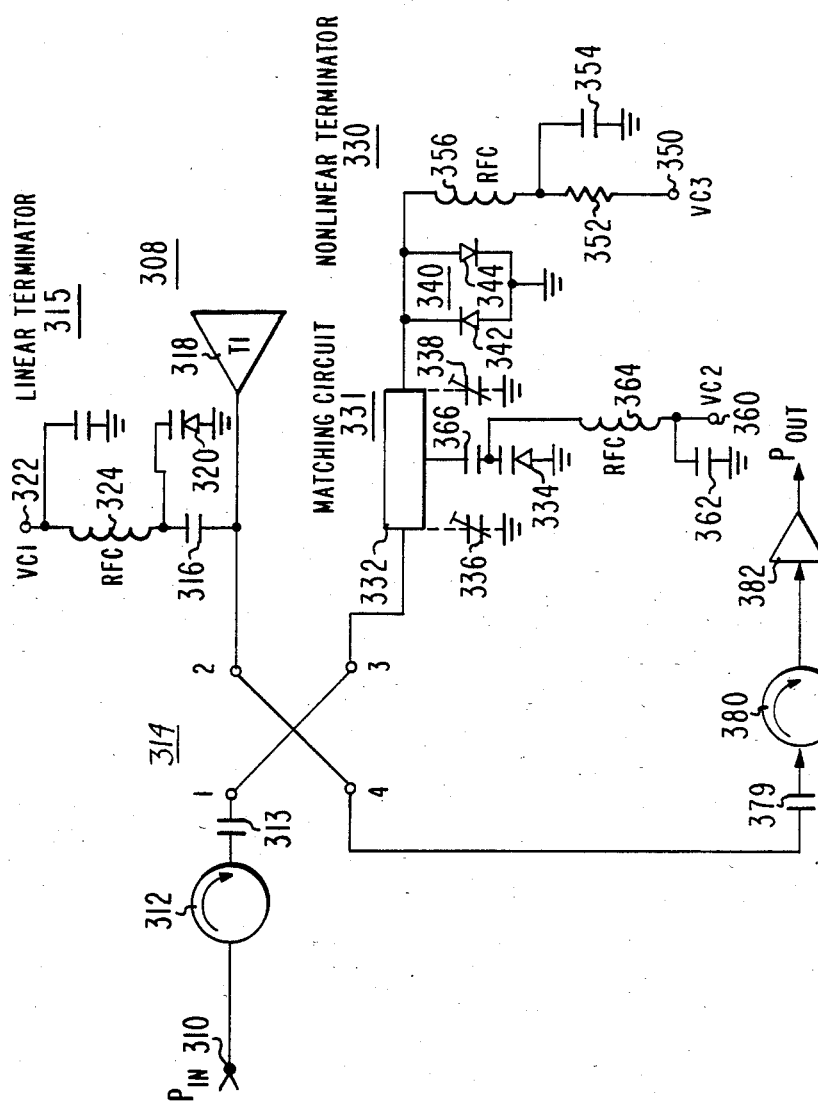
FIG. 3 is a schematic diagram of a predistortion circuit according to the invention.

FIG. 3 illustrates an amplifier 382 with a predistortion circuit designated generally as 308 in accordance with the invention. In FIG. 3, signal to be amplified is applied by way of an input terminal 310 to an isolator 312. Isolator 312 couples the signal by way of a blocking capacitor 313 to an input port designated 1 of a directional coupler designated generally as 314. Directional coupler 314 includes three additional ports designated 2, 3, and 4.

Directional coupler 314 is of the type commonly known as a "90°" or "3 db" directional coupler. Coupler 314 couples half the signal power applied to input port 1 to port 2 nominally without phase shift (actually, with a reference phase shift), and the other half to port 3 with a 90° phase shift relative to the reference phase shift. Similarly, half the signal power applied to port 2 is coupled to port 1 with a reference phase shift, and the other half is coupled to port 4 with an additional 90° relative phase shift. Signals applied to port 3 are similarly coupled to port 4 with the same reference phase shift and to port 1 with 90° additional phase shift relative to the reference phase shift.

Port 2 of coupler 314 is coupled to a linear termination designated generally as 315 which includes an open-circuited transmission line 318. It has been found that the bandwidth of the predistortion circuit is improved by use of a tapered transmission line, although the reason therefore is not clear but appears to be related to the change in phase as a function of frequency. The input end of transmission line 318 is coupled in parallel with a voltage-variable capacitance diode 320 by way of a DC blocking capacitor 316. Voltage VC1 for control of diode 320 is supplied to a terminal 322 and is coupled to diode 320 by way of a radio-frequency choke (RFC) 324. Open circuited transmission line 318 and voltage variable capacitance diode 320 present to port 2 of directional coupler 314 an impedance which is principally reactive. That portion of the signals applied to port 1 and coupled out of port 2 are reflected by the principally reactive termination and re-enter port 2 with a phase angle which is determined by the magnitude of the reactance. The magnitude of the reactance can be controlled by control voltage VC1.

That portion of the signals applied to port 1 and coupled to port 3 of directional coupler 314 are applied to a nonlinear termination designated generally as 330. The signals from port 3 are applied by way of a signal voltage transforming circuit or matching circuit designated generally as 331 to antiparallel-connected diodes designated together as 340 and including diodes 342 and 344. A control voltage VC3 is applied from a terminal 350 through a resistor 352, across a capacitor 354 and through a RFC 356 across antiparallel diodes 340. Matching circuit 331 includes a transmission line 332 loaded near its center by the capacitance of a voltage variable capacitance diode 334. A control voltage VC2 is coupled from a terminal 360 across a capacitor 362 and through a RFC 364 to the cathode of diode 334. A DC blocking capacitor 366 prevents control voltage VC2 from being coupled to transmission line 332 and thereby affecting diodes 340. Transmission line 332 may also be loaded by the capacitance of capacitors represented as 336 and 338 coupled across transmission line 332 at points along its length.

In operation, signals to be predistorted are applied to input port 1 of directional coupler 314, are power divided and applied from port 2 to its terminating impedance 315 and from port 3 to nonlinear terminating impedance 330. The signal reflected by linear termination 315 and nonlinear terminating impedance 330 are coupled back to ports 2 and 3, respectively, and appear combined at port 4. The predistorted signals at port 4 are applied by way of a DC blocking capacitor 379 and an isolator 380 to the input of amplifier 382.

Capacitors 334, 336, and/or 338 as required are adjusted to cause the impedance at the output end of matching circuit 330 to be higher or lower than the nominal impedance of the transmission lines of the amplifier-predistorter system (normally 50 or 75 ohms). If the impedance at the end of matching circuit 331 adjacent to diodes 340 is lower than the nominal characteristic impedance of the system at the frequencies of operation, the magnitude of the signa applied across diodes 340 is smaller than the signal that would be applied in the absence of matching circuit 331. This has substantially the same effect as would be achieved by placing a resistance in series with antiparallel diodes 340, namely reduction in the effective nonlinearity of diodes 340.

While the description is somewhat simplified in that it refers to correcting the voltage applied across the diodes to match the distortion of the diodes to the distortion of the amplifier, those skilled in the art will understand that the apparatus constitutes a nonlinear transformation of the diode impedance as a function of level to port 3 of the directional coupler. Thus, the input impedance of matching circuit 331 terminated in diodes 340 when adjusted to provide small signal across the diodes will be somewhat different from the impedance of the series combination of diodes 340 and a resistor.

If the impedance of capacitors 334, 336, and or 338 is adjusted so as to cause the impedance at the end of matching circuit 331 adjacent diodes 340 to be higher than the characteristic impedance of the system, then the magnitude of the signal voltage applied across diodes 340 is greater than that which would be available in the absence of the matching circuit. This causes an increase in the effective nonlinearity of diodes 340. This is a result which cannot be achieved by the use of a series-connected resistor. Such an arrangement is particularly advantageous when the signal level being predistorted is small, as where the amplifier for which the signal is being predistorted has very high gain.

As mentioned, matching circuit 331 is adjusted to provide the desired amount of nonlinearity, rather than to provide impedance matching. Consequently, diodes 340 will not in general present a matched output impedance to the output of matching circuit 330 in the sense that their impedances are equal. Consequently, a substantial portion of the signal energy flowing from port 3 through matching circuit 331 to diodes 340 will be reflected, and will once again pass through matching circuit 330, and will re-enter port 3 of directional coupler 314. The signals reflected from linear termination 315 to port 2 and from nonlinear termination 330 to port 3 add vectorially at port 4 and are applied by way of isolator 380 to the input terminal of the amplifier 382 for which predistortion is provided. Adjustment of the bias current impressed upon the diodes 342, 344 from terminal 350 can reduce the overall distortion of the combination of predistortion circuit 308 and amplifier 382. This may be due to slight differences in the offset voltages or differences in the nonlinear characteristics between diodes 342 and 344 of antiparallel-connected diodes 340, which may create an asymmetry and adversely affect the performance of the predistortion arrangement. Such differences in characteristics cause the nonlinearity impressed upon positive half cycles of the alternating-voltage waveform to be slightly different from that impressed upon negative half cycles and may cause residual distortion.

The predistortion circuit is aligned by applying a distortion measuring instrument such as a spectrum analyzer to the output of amplifier 382 to observe the distortion at the desired output power level. Control voltages VC1, VC2 and VC3 are adjusted in sequence to minimize the indicated distortion.

Figure 4:
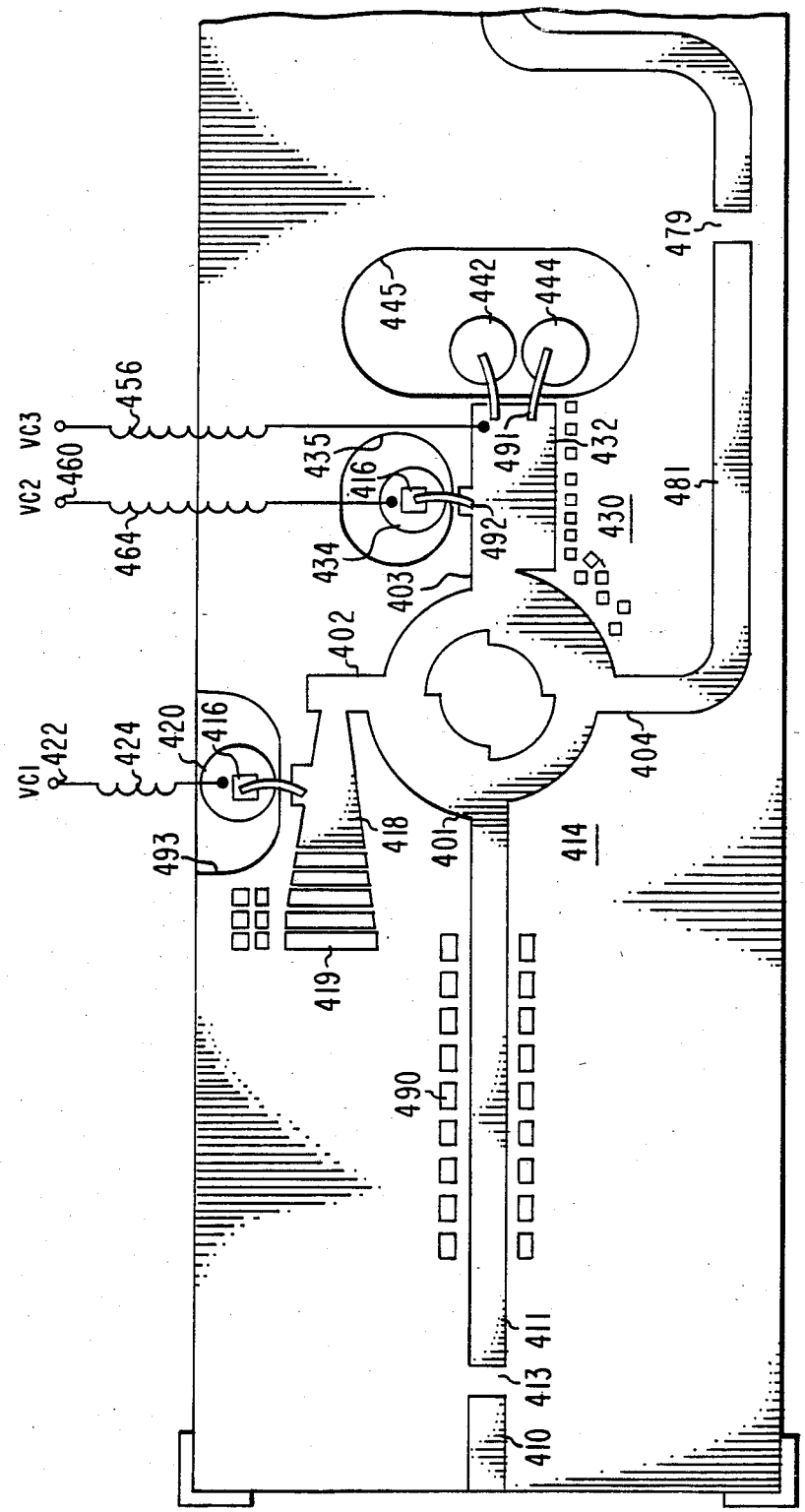
FIG. 4 is a diagram of the layout of an implementation of the predistortion circuit of FIG. 3.

FIG. 4 is the layout of the circuit illustrated schematically in FIG. 3 for operation in the frequency range of 11 to 12 GHz. The layout of FIG. 4 represents the conductive pattern on one side of a microstrip circuit having a dielectric consisting of a plate of alumina having a thickness of 0.025 inch (0.631 mm), the other side of which is totally metallized to provide a ground plane. In FIG. 4, conductive region 410 is an input transmission line, and gap 413 is a series DC blocking capacitor which couples signal to a further transmission line portion 411. The transmission lines of the embodiment have a width of 0.025 inch (0.631 mm) in order to provide approximately a 50 ohm characteristic impedance. Small metallization squares, one of which is designated as 490, are available for adjustment of the impedance of transmission line 411 to provide impedance match. Metallized region 490 is connected to the metallization of transmission line 411 as required by bridging the gap therebetween with indium solder. Transmission line 411 is coupled at a point 401 to a ring directional coupler designated generally as 414. Ring directional coupler 414 includes output ports 402, 403, and 404. Output port 404 is coupled to an output transmission line 481, which takes signals by way of an output DC blocking capacitor 479 to an amplifier (not shown). Output 402 of coupler 414 is coupled to a tapered transmission line 418. Additional separate metallization sections, one of which is illustrated as 419, allow control of the length of tapered transmission line 418 by successively bridging with Indium solder, as described above.

A nonlinear termination 430 is coupled to output port 403 of directional coupler 414. Termination 430 includes a transmission line 432 wider than 0.025 inches to provide a lower impedance than 50 ohms. The center of transmission line 432 is adjacent a through hole 435 in the alumina dielectric material, and the end of line 432 is adjacent a larger through hole 445. Diodes 442 and 444 are mounted in hole 445 on a conductive ground plane (not illustrated), and their top surfaces are connected to the end of transmission line 432 by bonding leads, one of which is designated 491. The end of transmission line 432 is also connected to one end of an air-core solenoidal RFC 456. The other end of RFC 456 is supported by a terminal strip, not illustrated. Transmission line 432 transforms the amptitude and phase of the transfer characteristic of diodes 442 and 444 to that required for optimum predistortion.

A voltage-variable capacitance diode 434 is mounted in hole 435 with its anode at the bottom and in contact with a conductive ground plane. A chip capacitor 416 is mounted atop diode 434, forming a vertical stack. A bond wire 492 couples the top of chip capacitor 416 to the center of transmission line 432. Bias voltage VC2 is coupled to the cathode of diode 434 from terminal 460 by a RFC 464. A further stack consisting of a voltage-variable capacitance diode 420 and a chip capacitor 416 is mounted in a cutout 493 in the alumina dielectric plate and is coupled by a bond wire to tapered transmission line 418. Bias voltage VC1 is coupled from terminal 422 to the cathode of diode 420 by a RFC 424.

Figure 5:
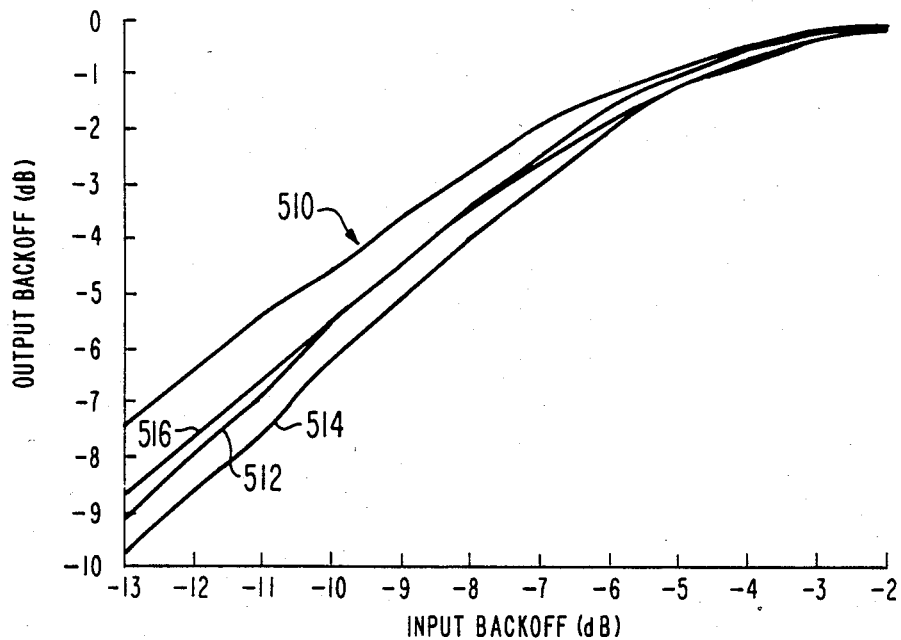
FIG. 5 is a plot of input power backoff versus resulting output power backoff for an amplifier alone and for the amplifier with the predistortion circuit of FIG. 4.

FIG. 5 illustrates the improvement in compression distortion which is achieved with a predistorted travelling-wave tube (TWT) by the use of a predistortion circuit arranged as in FIGS. 3 and 4. In FIG. 5, 510 illustrates the linearity of the travelling wave tube without predistortion at a frequenoy of 11.8 GHz. Ideally, for a linear amplifier without compression the output backoff should decrease by 1 db each time the input backoff is decreased by 1 db. The amount of nonlinearity in the region −7 to −12 db of input backoff (a difference of 5 db) is 4.3 db. Thus, even in the region well below saturation, the amplifier above has a 0.7 dB tendency to compression. By contrast, in the same region the combination of TWT and predistortion circuit has an output backoff of 5.4 db for a 5 db change in input backoff, or a net expansion of 0.4 dB. Thus, there is a slight expansion, as opposed to compression. Curve 512 represents the amplitude compression characteristics of the combination of predistortion circuit and TWT at 11.75 GHz, 514 is a similar curve for 11.85 GHz and 516 represents 11.95 GHz.

Figure 6:
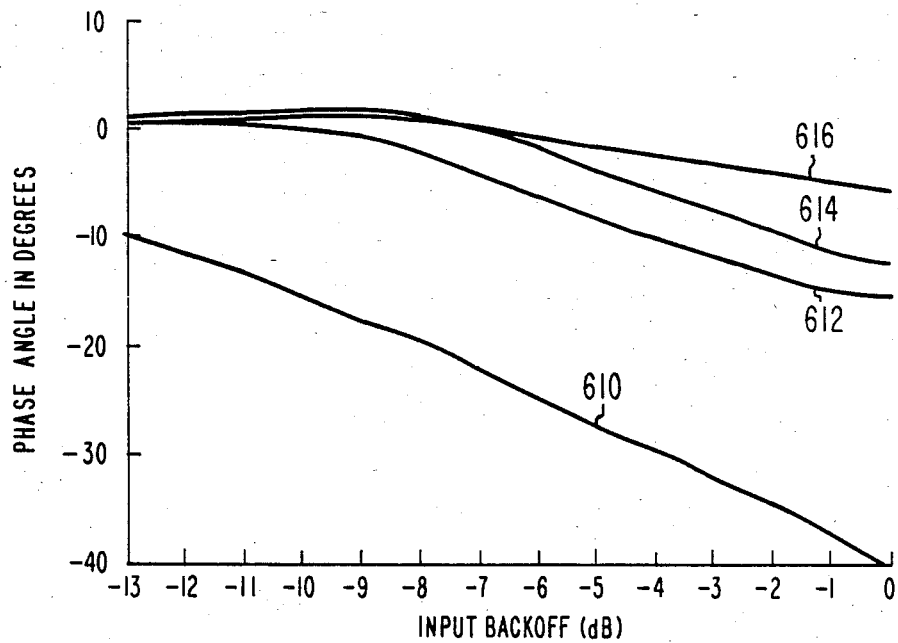
FIG. 6 is a plot of input power backoff versus resulting phase change for the same amplifier and predistortion circuit as for FIG. 5.

FIG. 6 illustrates phase characteristics of the TWT and of the combination of TWT and predistortion circuit. In FIG. 6, 610 illustrates the phase characteristic of the TWT alone at a frequency of 11.8 GHz, while curves 612, 614, and 616 illustrate the corresponding phase characteristic of the TWT plus predistortion circuit at 11.75, 11.85 and 11.95 GHZ, respectively.

Figure 7:
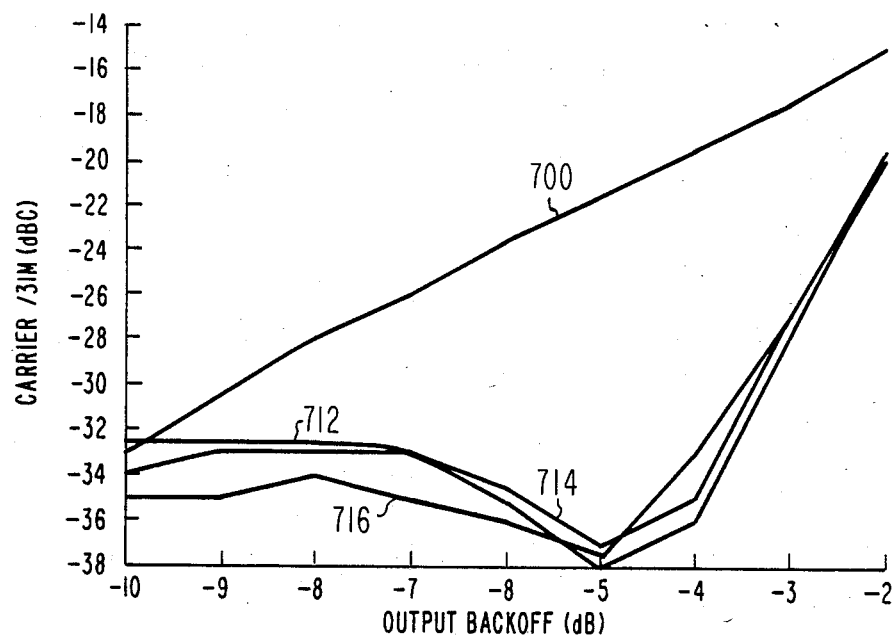
FIGS. 7 and 8 are a plots of output backoff versus third-order intermodulation/carrier ratio for the same amplifier and predistortion circuit as for FIG. 5.

FIG. 7 illustrates the ratio of carrier to third order intermodulation products (in decibels) as a function of output backoff. Curve 700 represents the TWT alone. Curves 712, 714 and 716 represent the performance of the combination of predistortion/TWT at various frequencies of operation. It can be seen that the third order intermodulation distortion is much smaller with the predistortion circuit in place.

Figure 8:
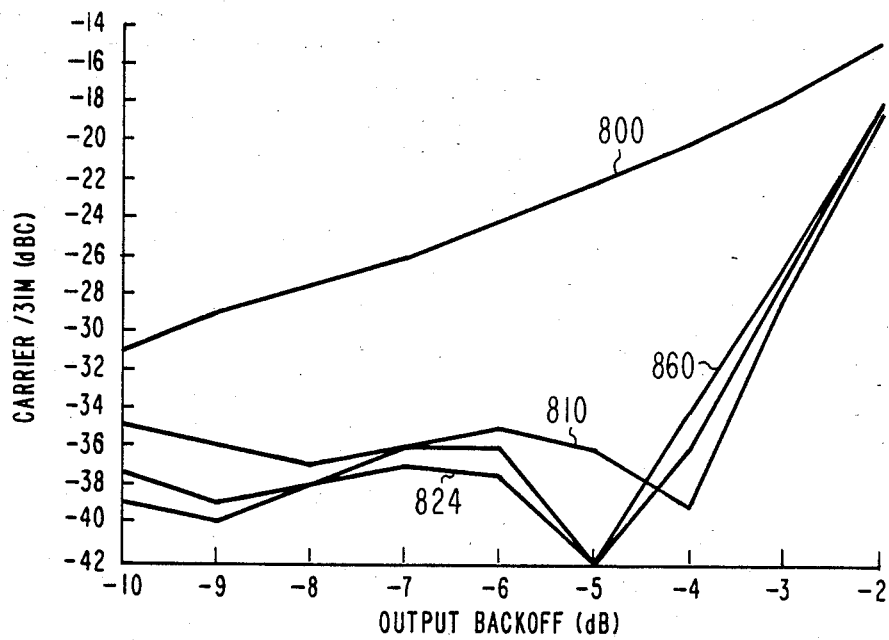

FIG. 8 illustrates the same information as FIG. 7 but over a range of operating temperatures, all at a frequency of 11.8 GHZ. Curve 800, for reference, is the response of the TWT at a temperature of 25° C., while curve 810 is for the combination of predistortion circuit and TWT at a temperature at −10° C., curve 824 is for a temperature of +24° C. and 860 for a temperture +60° C.

Figure 9:
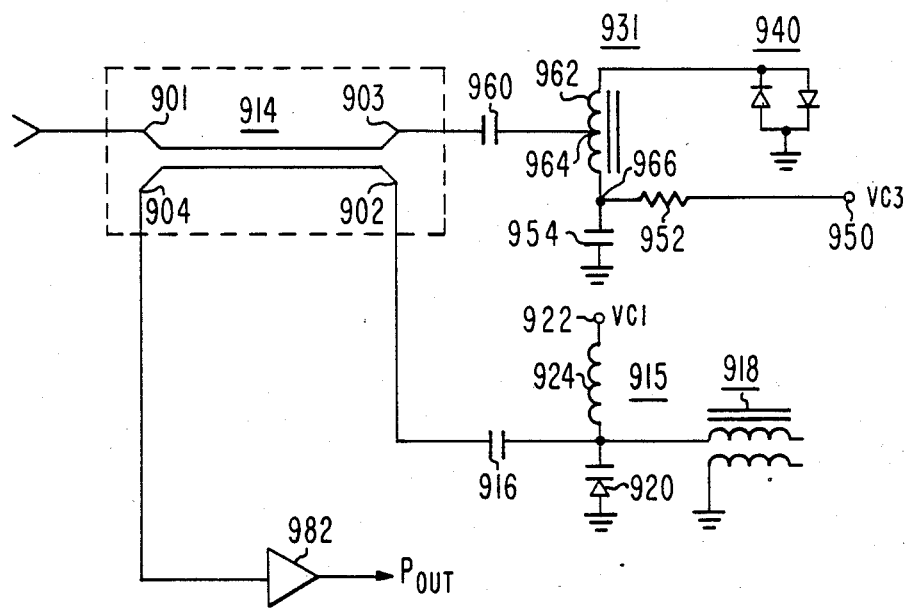
FIGS. 9 and 10 are diagrams illustrating alternative embodiments of the invention.

FIG. 9 illustrates another embodiment of the invention, most suited for frequencies below 1 GHz because of high-frequency restrictions on the permeability of ferrite cores at the current state of the art. In FIGURE 9, a directional coupler 914 has a port 902 coupled to a linear reactive circuit 915 which includes a variable capacitance diode 920 fed with voltage VC1 from a terminal 922 by way of an RFC 924. Also coupled across diode 920 is an open-circuited elevator coil or balun 918 which consists of a few turns of bifilar conductor wound on a ferrite core. Port 903 of coupler 914 is coupled by way of a blocking capacitor 960 to an impedance transformer designated generally as 931. Impedance transformer 931 includes an autotransformer 962 consisting of bifilar or trifilar windings in a ferrite toroid. The signal from port 903 is applied to tap 964 on autotransformer 962. The bottom leg of transformer 962 is coupled to ground by way of a capacitor 954. A stepped-up signal voltage appears across diodes 940, causing a greater signal swing across the transfer characteristic, and consequently providing correction for greater nonlinearity than without the impedance transformer. Bias voltage is applied across (or bias current is applied through) diodes 940 as in the case of FIG. 3, by applying the bias from terminal 950 through resistor 952 and through the windings of transformer 962.

Figure 10:
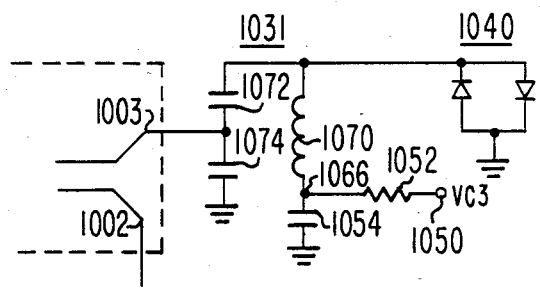

FIG. 10 illustrates a portion of a predistortion circuit generally similar to that of FIG. 9. In FIG. 10, a tuned transformer 1031 replaces autotransformer 931. Tuned transformer 1031 includes a parallel-resonant circuit with an inductor 1070 in parallel with the series combination of two capacitors, 1072 and 1074. As connected, the impedance across series capacitors 1072 and 1074 is greater than the impedance across capacitor 1074 alone, giving the same voltage step-up effect as the arrangement of FIG. 9 for signals at and near the resonant frequency of the parallel-resonant circuit.

Other embodiments of the invention will be apparent to those skilled in the art. For example, the directional coupler can be of the type described in U.S. Pat. No. 4,121,180 issued Oct. 17, 1978, to Greenway. If the signal level is very high, a resistor coupled in series with the antiparallel-connected diodes may be used in conjunction with an impedance transformation to reduce the amount of signal swing applied to the diodes. If broad bandwidth is not of great importance, a simple nontapered open circuited transmission line may be used instead of a tapered transmission line such as is illustrated. Improved adjustability of the phase correction may be achieved by coupling one or more controlled voltage variable capacitors to the open-circuited end of tapered transmission line 318.

What is claimed is:

1. A predistorted AC amplifier arrangement comprising:
   a directional coupler including first, second, third and fourth ports, said first and second ports being arranged for coupling signals therebetween with reference phase shift, said third and fourth ports being arranged for coupling signals therebetween with reference phase shift, said first and third ports being arranged for coupling signals therebetween with a phase-shift in quadrature with said reference phase shift, and said second and fourth ports being arranged for coupling signals therebetween with a phase shift in quadrature with said reference phase shift;
   a source of signal coupled to said first port;
   an amplifier coupled to said fourth port for receiving signals to be amplified, said amplifier having incremental gain which decreases at increasing signal ouput levels, whereby large-amplitude output signals experience a relative compression;
   a reactive network coupled to said second port, said reactive network comprising capacitive means coupled in parallel with a first end of a transmission line including a second end which is open-circuited;
   antiparallel-connected diodes having an input-output voltage characteristic similar to that of said amplifier but at a different impedance level;
   bias means for biasing said antiparallel-connected diodes with a direct current for adjusting said input-output voltage characteristic to match said incremental gain; and
   impedance transforming means coupled to said third port and to said antiparallel-connected diodes for coupling the impedance-transformed input-output voltage characteristic of said antiparallel-connected diodes to said third port whereby the reflected signals from said reactive network and said antiparallel-connected diodes add at said fourth port in such a fashion as to be predistorted to offset said relative compression.

2. An arrangement according to claim 1 wherein said transmission line has an impedance at said second end which is lower than the impedance at said first end.

3. An arrangement according to claim 2 wherein said impedance transforming means is tuned and comprises a length of second transmission line and capacitive means loading the center of said second transmission line.

4. An arrangement according to claim 1 wherein said impedance transforming means comprises a length of transmission line and capacitive means loading the center of said transmission line.

5. An arrangement according to claim 4 wherein said length of transmission line has a lower characteristic impedance than the input and output impedances of said directional coupler.

6. A predistortion arrangement, comprising:
   an amplifier exhibiting nonlinearity of its output signals at a desired output signal level, and having a gain which together with said desired output level defines a desired input signal level, and also being characterized for operation at a predetermined input and output impedance level;
   a circuit coupled to said amplifier for generating an input signal at said input signal level, including a two-terminal device having a nonlinear transfer characteristic, said nonlinear transfer characteristic including a first region exhibiting nonlinearity less than that of said amplifier at said desired output level, a second region exhibiting nonlinearity substantially equal to that of said amplifier at said desired output level, and a third region exhibiting nonlinearity greater than that of said amplifier of said desired output level, said nonlinear device operating in one of said first and third regions when driven from said predetermined impedance level to produce said input signal at said input signal level; and
   signal transforming means coupled to said device for setting the signal level across said device during operation to produce said input signal at said input signal level to establish operation in said second region.

7. An arrangement according to claim 6 wherein said circuit further comprises:
   bias means coupled to said two-terminal device for establishing one of a direct voltage across and a direct current through said device.

8. An arrangement according to claim 6, wherein said two-terminal device comprises a first diode.

9. An arrangement according to claim 8, further comprising a second diode antiparallel coupled with said first diode.

10. An arrangement according to claim 6 wherein said circuit further comprises:
    a quadrature directional coupler including a signal input port and second, third and fourth ports;
    a substantially reactive linear termination coupled to said second port;
    coupling means coupled to said third port and by way of said signal transforming means to said two-terminal device; and
    second coupling means coupled to said fourth port and to said amplifier for coupling predistorted signals to said amplifier.

11. An arrangement according to claim 10 further comprising bias means coupled to said two-terminal device for establishing one of a direct voltage across said two-terminal device and a direct current through said two-terminal device.

12. An arrangement according to claim 11 wherein said two-terminal device comprises a first diode.

13. An arrangement according to claim 12 wherein said two-terminal device comprises a second diode antiparallel-connected with said first diode.

14. An arrangement comprising:
    a source of signals to be amplified;
    an amplifier having gain and exhibiting nonlinearity of its output signals at a desired output signal level, said gain and output signal level together determining the input signal level necessary at an input terminal;
    a nonlinear circuit coupled to said source of signals and to said input terminal of said amplifier for predistorting said signals from said source and for coupling predistorted signals to said input terminal of said amplifier, said nonlinear circuit including a nonlinear device having a transfer characteristic including a first region exhibiting nonlinearity less than said nonlinearity of said amplifier at said desired output signal level, a second region exhibiting nonlinearity substantially equal to said nonlinearity of said amplifier at said desired output signal level, and a third region exhibiting nonlinearity greater than said nonlinearity of said amplifier at said desired output signal level, said nonlinear device operating in said first region in response to said input signal level whereby predistortion is not adequate; and signal transforming and coupling means coupled to said source, to said input terminal of said amplifier and to said device for transforming said input signal level to a level for operating said device in said second region whereby said distortion is compensated.

15. An arrangement according to claim 14 wherein said amplifier has a large gain whereby a relatively small input signal level is required whereby said nonlinear device would operate in said first region in the absence of an impedance transformation, and wherein said signal transforming and coupling means transforms said input level to a higher signal level for operating said nonlinear device in said second region.

16. An arrangement according to claim 15 wherein said nonlinear device comprises a diode and said higher signal level creates a greater voltage excursion across the transfer characteristic of said diode.

17. An arrangement according to claim 16 further comprising biasing means coupled to said diode for producing one of a direct voltage and a direct current through said diode.

18. An arrangement according to claim 17 further comprising a second diode antiparallel connected with said first-mentioned diode.

19. An arrangement according to claim 18 wherein said nonlinear circuit further comprises:

a four-port 90° directiona coupler having a first port coupled to said source of signal to be amplified, a second port coupled to said input terminal of said amplifier, a third port coupled to said first and second diodes by way of said signal transforming and coupling means, and a fourth port; and an open-circuited transmission line having an input end coupled to said fourth port.

20. An arrangement according to claim 19 wherein said signal transforming and coupling means comprises a tuned transmission line coupled to said third port and to said first and second diodes.

21. A predistortion circuit comprising:

a four port 90° directional coupler having first, second, third and fourth ports, said first port being adapted for receiving signals to be predistorted;

a tapered transmission line having a first end coupled to said second port and a second end open-circuited;

first voltage variable capacitance means coupled in parallel with said first end of said tapered transmission line;

first control means coupled to said first voltage variable capacitance means for controlling the voltage thereacross;

second transmission line means having a first end coupled to said third port and also having a second end;

second voltage variable capacitance means coupled across said second transmission line means at a point along its length;

second control means coupled to said second voltage variable capacitance means for controlling the voltage thereacross;

first and second antiparallel connected diodes coupled across said second end of said second transmission line means; and third control means coupled to said antiparallel connected diodes for controlling the bias applied thereto, whereby predistorted signals are generated at said fourth port of said directional coupler.

* * * * *